US006963117B2

(12) United States Patent
Yang et al.

(10) Patent No.: US 6,963,117 B2
(45) Date of Patent: Nov. 8, 2005

(54) MICROELECTROMECHANICAL DEVICE USING RESISTIVE ELECTROMECHANICAL CONTACT

(75) Inventors: Woo-seok Yang, Daejon (KR); Sung-hae Jung, Daejon (KR); Sung-weon Kang, Daejon (KR); Yun-tae Kim, Daejon (KR)

(73) Assignee: Electronics and Telecommunications Research Institute, (KR)

( * ) Notice: Subject to any disclaimer, the term of this patent is extended or adjusted under 35 U.S.C. 154(b) by 60 days.

(21) Appl. No.: 10/230,563

(22) Filed: Aug. 29, 2002

(65) Prior Publication Data

US 2003/0222321 A1 Dec. 4, 2003

(30) Foreign Application Priority Data

Jun. 4, 2002 (KR) ...................... 10-2002-0031288

(51) Int. Cl.[7] ............................................... H01L 29/82
(52) U.S. Cl. ...................... 257/415; 257/416; 257/419; 200/512
(58) Field of Search .......................... 385/18; 361/233, 361/275.3, 278, 281, 283.4, 298.2, 258.2; 343/768, 767, 700 MS; 250/338.1; 342/371; 257/414, 415, 417, 418, 420, 416, 419; 200/181, 200/512, 237, 262, 263, 268; 333/105, 204, 333/246

(56) References Cited

U.S. PATENT DOCUMENTS

| | | | | |
|---|---|---|---|---|
| 4,959,515 | A * | 9/1990 | Zavracky et al. | 200/181 |
| 5,258,591 | A | 11/1993 | Buck | |
| 5,447,600 | A | 9/1995 | Webb | |
| 5,578,976 | A | 11/1996 | Yao | |
| 6,146,906 | A | 11/2000 | Inoue et al. | |
| 6,281,838 | B1 * | 8/2001 | Hong | 342/371 |
| 6,331,257 | B1 * | 12/2001 | Loo et al. | 216/13 |
| 6,376,787 | B1 | 4/2002 | Martin et al. | |
| 6,496,351 | B2 * | 12/2002 | Hill et al. | 361/278 |
| 6,583,915 | B1 * | 6/2003 | Hong et al. | 359/237 |

* cited by examiner

*Primary Examiner*—Minhloan Tran
*Assistant Examiner*—Tan Tran
(74) *Attorney, Agent, or Firm*—Blakely, Sokoloff, Taylor & Zafman

(57) ABSTRACT

A microelectromechanical device that transmits an electric signal using mechanical contact between conductors is provided. The microelectromechanical device has a conductive oxide layer on at least one of contacting surfaces of the conductors. The conductor may be a signal line or a contact pad. According to the microelectromechanical device, the signal line or the contact pad is coated with the conductive oxide layer, thereby preventing the occurrence of micro-welding problem due to resistive heat. As a result, a reliability and a power handling of a microelectromechanical device can be improved.

20 Claims, 3 Drawing Sheets

MICROELECTROMECHANICAL DEVICE USING RESISTIVE ELECTROMECHANICAL CONTACT

BACKGROUND OF THE INVENTION

1. Field of the Invention

The present invention relates generally to a microelectromechanical device and more particularly to a microelectromechanical device using resistive electromechanical contact.

2. Description of the Related Art

There are many microelectromechanical devices using resistive electromechanical contact between conducting elements and one example is a resistive microelectromechanical switch which switches on or off input and output terminals of a signal transmission line. Contact characteristics of a resistive microelectromechanical device affects its electrical performance such as power loss, power handling, and reliability. For a resistive switch, high contact resistance in the on-state results in large power loss and large resistive heat (Joule heat), which causes limited power handling and poor reliability. Electromechanical contact used by a microelectromechanical device transmits an electronic signal through mechanically contacting at least two conducting elements. And it is different from solid-state electronic contact, where an electronic signal is transmitted through at least two conducting elements in a solid body, used by a semiconductor device. Unlike in the solid-state electronic contact, high contact resistance and resultant large resistive heat may be generated in electromechanical contact between conducting elements with low resistivity. In general, the large resistive heat causes micro-welding problem on contacting surfaces of two conductors, and a device failure to return to on state, that is non-contact state. The micro-welding problem becomes more serious with the higher transmission power through the contact, the longer on-state time and the more on/off cycles, because of the larger resistive heat, the longer time for heat accumulation and the larger thermomechanical damage on the contacting surfaces. Accordingly, in order to improve the reliability, lifetime and power handling of microelectromechanical devices using resistive electromechanical contact, it is necessary to effectively prevent the micro-welding problem occurring on contacting surfaces of two conductors.

In general, in a microelectromechanical device using resistive electromechanical contact, a contact pad, which connects input and output terminals, is formed of gold (Au) as a signal line. This is to reduce power loss by maintaining low resistivity, e.g., $-2\times10^{-6}$ Ω cm, even during a post-process under an oxidation ambient. However, gold has poor thermomechanical characteristics and thus is vulnerable to the micro-welding problem, which is inevitably generated at electromechanically contacting surfaces of two conductors due to resistive heat. To solve this problem, it is suggested that the gold contact pad be coated with platinum (Pt) that has higher resistivity of $-1\times10^{-5}$ Ω, but better thermomechanical characteristics than gold. This suggestion will now be explained with reference to FIG. 1.

FIG. 1 is a cross-sectional view of a cantilever switch that is one of general microelectromechanical devices. Referring to FIG. 1, the cantilever switch is formed on a substrate 20, and includes an anchor 12, a contact pad 16, and a pull-down electrode 18. A cantilever 14 includes one end portion 22 connected to the anchor 12, a central portion 24 above the contact pad 16, and the other end portion 26 above the pull-down electrode 18. The cantilever 14 is formed of a platinum layer 25 and a gold layer 23. The contact pad 16 is formed of a titanium layer 36, a gold layer 38, and a platinum layer 40. The pull-down electrode 18 is formed of a titanium layer 32 and a gold layer 34. In operation, the cantilever switch of FIG. 1 is switched on when the pull-down electrode 18 is given an electrostatic charge from a power supplier 30 and thus the cantilever 14 is connected to the contact pad 16. On the contrary, the pull-down electrode 18 is not provided by an electrostatic charge, the cantilever 14 is disconnected from the contact pad 16, and thus, the cantilever switch is in the off state.

As previously mentioned, a general cantilever switch has a contact pad which is a gold layer covered with a platinum layer. However, platinum is noble metal like gold, and thus, its thermomechanical features is so poor that cannot basically prevents the occurrence of micro-welding problem.

SUMMARY OF THE INVENTION

To solve the above problem, it is an object of the present invention to provide a microelectromechanical device that increases thermomechanical characteristics between contact pads, thereby preventing the occurrence of a micro-welding problem.

To achieve one aspect of the above object, there is provided a micro-electromechanical device transmitting an electric signal using mechanical contact between conductors, the microelectromechanical device comprising a conductive oxide layer on at least one of contacting surfaces of the conductors. Preferably, the body of each conductor is formed of a noble metal layer and coated with the conductive oxide layer.

To achieve another aspect of the above object, there is provided a microelectromechanical device transmitting an electric signal using mechanical contact between conductors, wherein one of these conductors is a single conductive oxide layer.

Preferably, the conductive oxide layer is formed of ruthenium oxide, iridium oxide, indium oxide, tin oxide, zinc oxide, or indium tin oxide. Also, preferably, the conductive oxide layer is formed by a physical vapor deposition method such as a reactive magnetron sputtering method, or a chemical vapor deposition method such as a metal organic chemical vapor deposition method.

To achieve still another aspect of the above object, there is provided a microelectromechanical device including a signal line that is formed on a substrate and whose input and output terminals are separated from each other at a predetermined gap, a bottom electrode formed on the substrate while being separated from the signal line, an anchor formed on the substrate while being separated from the bottom electrode, a cantilever, one end of which is fixed to the anchor and the other end of which is suspended vertically to the bottom electrode, an open portion of the signal line and the substrate at a predetermined space, a contact pad formed on the other end of the cantilever to face the open portion of the signal line, and a top electrode formed on the cantilever to face the bottom electrode, wherein at least one of the signal line and the contact pad is coated with a conductive oxide layer.

Preferably, the body of each of the signal line and the contact pad is formed of a noble metal layer and coated with the conductive oxide layer.

To achieve still another aspect of the above objects, there is provided a microelectromechanical device including a signal line formed on a substrate and whose input and output terminals are separated from each other, a bottom electrode formed on the substrate while being separated from the signal line, an anchor formed on the substrate while being separated from the bottom electrode, a cantilever, one end of which is fixed to the anchor and the other end of which is suspended vertically to the bottom electrode, an open portion of the signal line, and the substrate, a contact pad formed of a conductive oxide layer on the other end of the cantilever to face the open portion of the signal line, and a top electrode formed on the cantilever.

Preferably, the signal line is formed of a noble metal layer. Preferably, the conductive oxide layer is formed of ruthenium oxide, iridium oxide, indium oxide, tin oxide, zinc oxide, or indium tin oxide. Preferably, the conductive oxide layer is formed by a physical vapor deposition method such as a reactive magnetron sputtering method, or a chemical vapor deposition such as a metal organic chemical vapor deposition method.

In a microelectromechanical device according to the present invention, a signal line or a contact pad is coated with a conductive oxide layer to prevent the occurrence of micro welding problem, thereby increasing the reliability and power handling of the microelectromechanical device.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
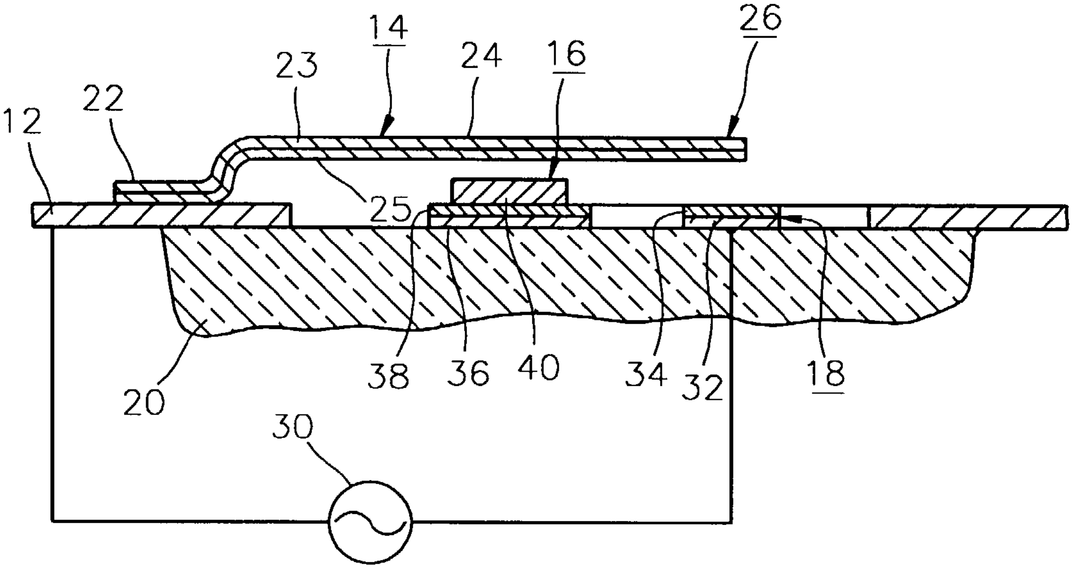
FIG. 1 (PRIOR ART)
FIG. 1 is a cross-sectional view of a cantilever switch that is one of general microelectromechanical switches.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. The same reference numerals in different drawings represent the same element, and thus their description will be omitted.

The present invention may be applied to various resistive, microelectromechanical devices that use mechanical contact between conductors to transmit an electric signal. More specifically, a resistive, microelectromechanical device according to the present invention is advantageous in that at least one of contacting surfaces of conductors is coated with a conductive oxide layer, which has better thermomechanical characteristics than noble metal, thereby preventing the occurrence of micro-welding. Here, the conductive oxide layer may be deposited on a noble metal layer, which constitutes the body of each conductor, or each conductor may be formed of a single conductive oxide layer.

The conductive oxide layer has lower resistivity and greater thermomechanical characteristics. In particular, the conductive oxide layer has low resistivity, e.g., $10^{-4}$ Ω, even at low formation temperature so that it can prevent thermal deformation, such as surface roughening, of the noble metal layer that constitutes the body of a conductor. Here, the conductive oxide layer may be ruthenium oxide, iridium oxide, indium oxide, tin oxide, zinc oxide, or indium tin oxide.

A process of forming the conductive oxide layer requires the technologies that provide a good-quality thin layer even at a low deposition temperature, and productive conditions such as an easy and low-cost manufacturing process and high through put. To satisfy these requirements, this process may be performed by a physical vapor deposition method such as a reactive magnetron sputtering method that uses target metal and a mixture gas containing oxygen, and a chemical vapor deposition method such as a metal organic chemical vapor deposition method that uses a mixture gas containing a metal organic source and oxygen.

There are cantilever-type radio-frequency (RF) and microwave switches as representative resistive microelectromechanical devices. A preferred embodiment of the present invention will be explained regarding a cantilever-type resistive switch in a greater detail. In the cantilever-type resistive switch, a conductor may be a signal line or a contact pad.

Figure 2:
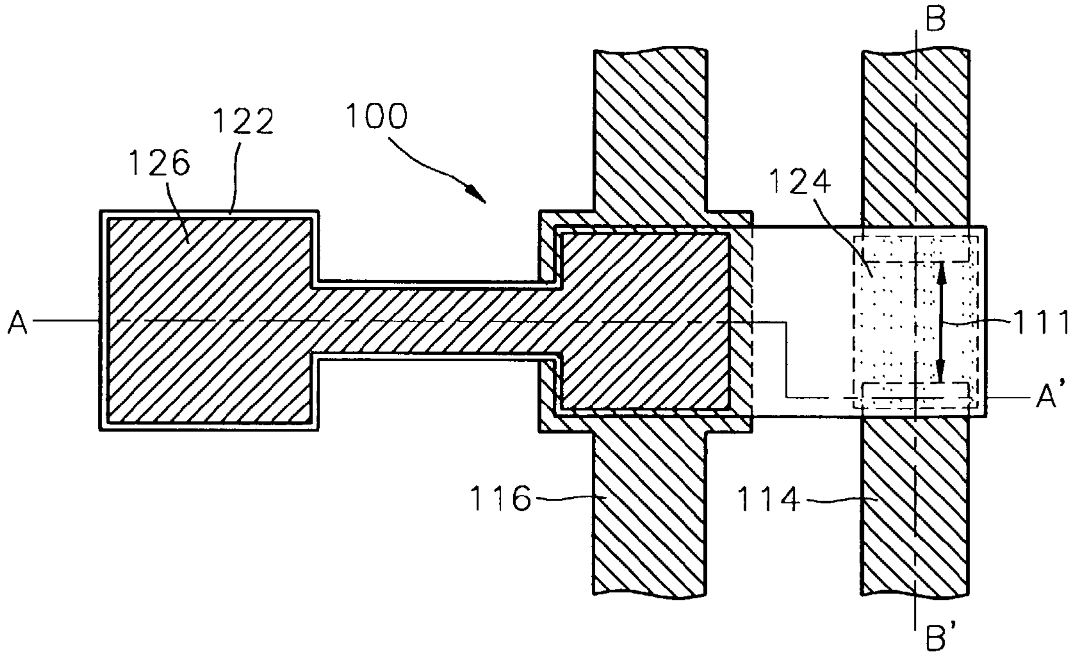
FIG. 2 is a plan view of a cantilever switch that is an embodiment of microelectromechanical switches according to the present invention.
Figure 3:
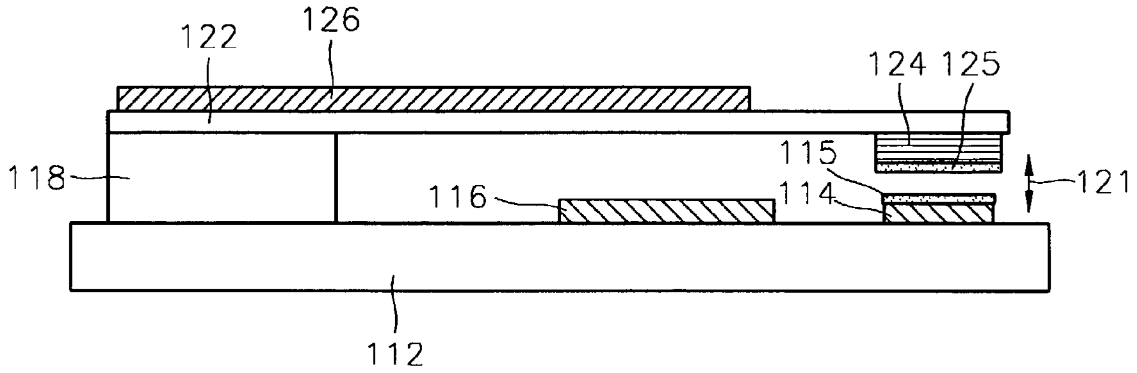
FIG. 3 is a cross-sectional view of the cantilever switch of FIG. 2, taken along line A–A'.
Figure 4:
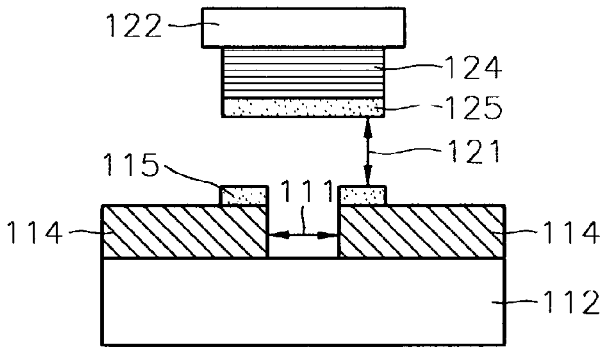
FIG. 4 is a cross-sectional view of an embodiment of the cantilever switch of FIG. 2, taken along line B–B'.

FIG. 2 is a plan view of a cantilever switch 100 that is an embodiment of the present invention. FIG. 3 is a cross-sectional view of the cantilever switch 100 of FIG. 2, taken along line A–A'. FIG. 4 is a cross-sectional view of the cantilever switch 100 of FIG. 2, taken along line B–B'.

In detail, the cantilever switch 100 is manufactured on an insulating substrate 112, using a microfabrication process such as a photolithography process, a deposition process, and an etching process. The cantilever switch 100 consists of largely two parts: a fixed part fixed to the substrate 112; and an actuating part that mechanically deflects while being suspended vertically to the fixed part at a predetermined space.

The fixing part includes a signal line 114 whose input and output terminals are apart from each other at a predetermined gap 111 to form an open circuit, a bottom electrode 116 connected to ground while being separated from the signal line 114, and an anchor 118 that fixes one end of the actuating part on the substrate 112 while being distant from the bottom electrode 116.

The actuating part has a cantilever 122, one end of which is fixed to the substrate 112 via the anchor 118 and the other end of which is suspended with regard to the substrate 112 at a predetermined at a space 121; a contact pad 124 that is formed on the other end of the cantilever 122 to face the predetermined gap 111 of the signal line 114; and a top electrode 126 that is formed on the cantilever 122 and to which DC voltage is applied.

The anchor 118 and the cantilever 122 are formed of insulating materials such as silicon oxide, silicon nitride, polyimide, and polymethyl methacrylate (PMMA). The bodies of the signal line 114, the bottom electrode 116, the contact pad 124, and the top electrode 126 are formed of noble metal layers such as gold, platinum, and palladium that have low resistivity under oxygen atmosphere. In addition, an adhesive layer (not shown) may be formed between insulating elements, e.g., the substrate 120 and each noble metal layer, so as to increase adhesive strength therebetween.

Also, the cantilever switch 100 includes conductive oxide layers 115 and 125 on the signal line 114 and the contact pad 124, respectively, so as to prevent the micro-welding problem occurring on contacting surfaces of the signal line 114 and the contact pad 124. As previously described, the conductive oxide layers 115 and 125 are formed of ruthenium oxide, iridium oxide, indium oxide, tin oxide, zinc oxide, or indium tin oxide that has low resistivity and greater thermomechanical characteristics. Preferably, each conductive oxide layer is formed in a thickness of 200–2000 Å. Also, as described above, to prevent thermal deformation of the noble metal layers constituting the bodies of conductors, the conductive oxide layers 115 and 125 may be formed by the physical vapor deposition method such as the reactive magnetron sputtering method using a mixture gas containing target metal and oxygen, or the chemical vapor deposition method such as the metal organic chemical vapor deposition method using a mixture gas containing a metal organic source and oxygen.

The cantilever switch 100 is switched off when the signal line 114 and the contact pad 124 are apart from each other at the predetermined space 121, and switched on when DC voltage is applied to the top electrode 126 and the cantilever 122 moves toward the bottom electrode 116 due to electrostatic force between the bottom and top electrodes 116 and 126, thus the predetermined space 121 becomes zero. That is, the cantilever switch 100 is in the on-state if the signal line 114 contacts the contact pad 124 without the predetermined space 121. However, when the DC voltage applied to the top electrode 126 is rejected, the signal line 114 and the contact pad 124 are again separated from each other and the cantilever switch 100 is switched off, owing to the elastic restoring force of the cantilever 122, one end of which is fixed to the substrate 112 via the anchor 118.

FIGS. 5 through 8 are cross-sectional views of various embodiments of the cantilever switch 100 of FIG. 2, taken along line B–B'.

Figure 5:
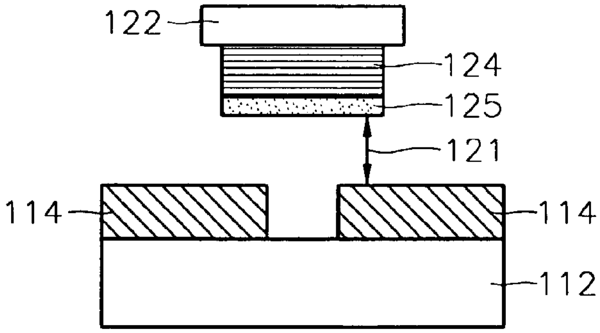
FIG. 5 is a cross-sectional view of another embodiment of the cantilever switch of FIG. 2, taken along line B–B'.
Figure 6:
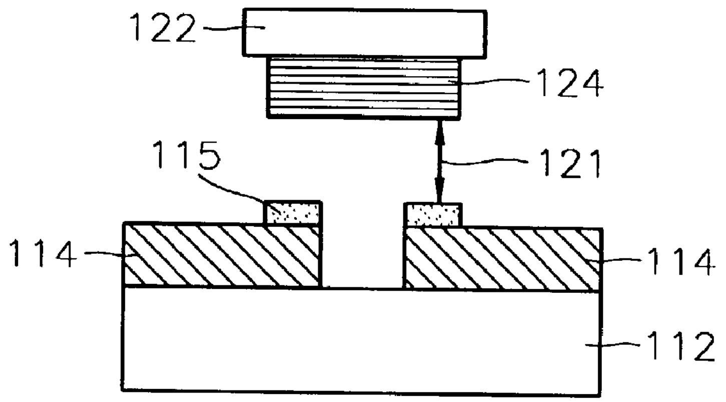
FIG. 6 is a cross-sectional view of still another embodiment of the cantilever switch of FIG. 2, taken along line B–B'.
Figure 7:
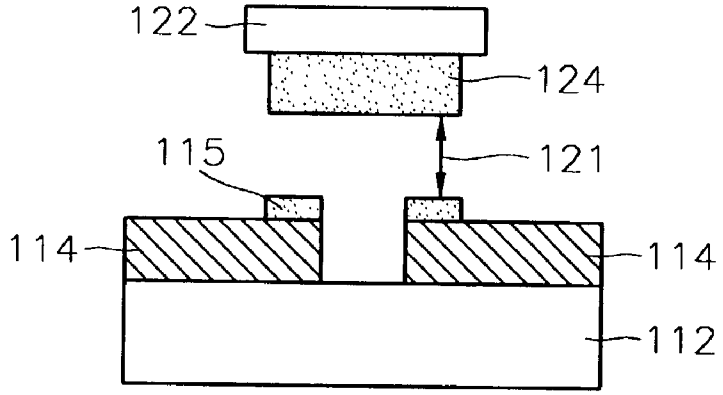
FIG. 7 is a cross-sectional view of still another embodiment of the cantilever switch of FIG. 2, taken along line B–B'.
Figure 8:
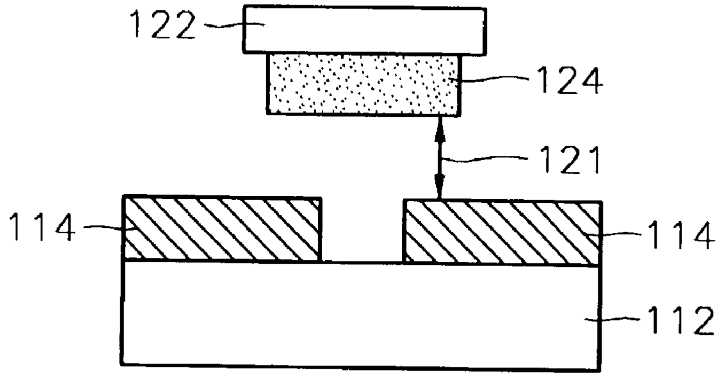
FIG. 8 is a cross-sectional view of still another embodiment of the cantilever switch of FIG. 2, taken along line B–B'.

A cantilever switch according to the present invention may include both or one of conductive oxide layers, depending on the specifications for reliability and power handling of the cantilever switch 100. FIGS. 5 and 6 are cross-sectional views of embodiments of the cantilever switch 100 of FIG. 2 that include one of the conductive oxide layers 115 and 125, respectively, whereas the cantilever switch 100 of FIG. 3 includes both these layers 115 and 125. Otherwise, as shown in FIGS. 7 and 8, according to the specification for power loss of the cantilever switch 100, the contact pad 124 may be formed of conductive oxide because its transmission path through which an RF signal or a microwave signal passes is shorter than that of the signal line 114.

As described above, a microelectromechanical device according to the present invention has conductive oxide layers at contacting surfaces of electromechanical elements, e.g., a signal line and a contact pad, thereby preventing the occurrence of the micro-welding problem due to resistive heat. Accordingly, a reliability and a power handling of a microelectromechanical device can be improved by effectively preventing the micro-welding problem at a resistive electromechanical contact.

What is claimed is:

1. A microelectromechanical device transmitting an electric signal using mechanical contact between conductors each having a body, the microelectromechanical device comprising a conductive oxide layer on at least one of contacting surfaces of the conductors, wherein the conductive oxide layer is formed of ruthenium oxide, iridium oxide, indium oxide, tin oxide, or zinc oxide and the body of each conductor is formed of a noble metal layer and coated with the conductive oxide layer.

2. The microelectromechanical device of claim 1, wherein the conductive oxide layer is formed by a physical vapor deposition method such as a reactive magnetron sputtering method, or a chemical vapor deposition method such as metal organic chemical vapor deposition method.

3. A microelectromechanical device transmitting an electric signal using mechanical contact between conductors each having a body, wherein one of these conductors has a single conductive oxide layer, wherein the conductive oxide layer is formed of ruthenium oxide, iridium oxide, indium oxide, tin oxide, or zinc oxide, and the body of each conductor is formed of a noble metal layer and coated with the conductive oxide layer.

4. The microelectromechanical device of claim 3, wherein the conductive oxide layer is formed by a physical vapor deposition method such as a reactive magnetron sputtering method, or a chemical vapor deposition method such as a metal organic chemical vapor deposition method.

5. A microelectromechanical device comprising:

a signal line formed on a substrate, the signal line whose input and output terminals are separated from each other at a predetermined gap;

a bottom electrode formed on the substrate while being separated from the signal line;

an anchor formed on the substrate while being separated from the bottom electrode;

a cantilever, one end of which is fixed to the anchor and the other end of which is suspended vertically to the bottom electrode, an open portion of the signal line and the substrate at a predetermined space;

a contact pad formed on the other end of the cantilever to face the open portion of the signal line; and a top electrode formed on the cantilever;

wherein at least one of the signal line and the contact pad is coated with a conductive oxide layer, wherein the conductive oxide layer is formed of ruthenium oxide, iridium oxide, indium oxide, tin oxide, or zinc oxide, and the body of each of the signal line and the contact pad is formed of a noble metal layer and coated with the conductive oxide layer.

6. The microelectromechanical device of claim 5, wherein the conductive oxide layer is formed by a physical vapor deposition method such a reactive magnetron sputtering method, or a chemical vapor deposition such as a metal organic chemical vapor deposition method.

7. A microelectromechanical device comprising:

a signal line formed on a substrate, the signal line whose input and output terminals are separated from each other;

a bottom electrode formed on the substrate while being separated from the signal line;

an anchor formed on the substrate while being separated from the bottom electrode;

a cantilever, one end of which is fixed to the anchor and the other end of which is suspended vertically to the bottom electrode, an open portion of the signal line, and the substrate;

a contact pad formed of a conductive oxide layer on the other end of the cantilever to face the open portion of the signal line; and a top electrode formed on the cantilever, wherein the conductive oxide layer is formed of ruthenium oxide, iridium oxide, indium oxide, tin oxide, or zinc oxide, and the signal line is formed of a noble metal layer.

8. The microelectromechanical device of claim 7, wherein the conductive oxide layer is formed by a physical vapor deposition method such as a reactive magnetron sputtering method, or a chemical vapor deposition such as a metal organic chemical vapor deposition method.

9. A microelectromechanical device transmitting an electric signal using mechanical contact between conductors each having a body, the microelectromechanical device comprising a conductive oxide layer on at least one of contacting surfaces of the conductors, wherein the body of each conductor is formed of a noble metal layer and coated with the conductive oxide layer.

10. The microelectromechanical device of claim 9, wherein the conductive oxide layer is formed of ruthenium oxide, iridium oxide, indium oxide, tin oxide, zinc oxide, or indium tin oxide.

11. The microelectromechanical device of claim 9, wherein the conductive oxide layer is formed by a physical vapor deposition method such as a reactive magnetron sputtering method, or a chemical vapor deposition method such as metal organic chemical vapor deposition method.

12. A microelectromechanical device transmitting an electric signal using mechanical contact between conductors each having a body, wherein one of these conductors has a single conductive oxide layer, wherein the body of each conductor is formed of a noble metal layer and coated with the conductive oxide layer.

13. The microelectromechanical device of claim 12, wherein the conductive oxide layer is formed of ruthenium oxide, iridium oxide, indium oxide, tin oxide, zinc oxide, or indium tin oxide.

14. The microelectromechanical device of claim 12, wherein the conductive oxide layer is formed by a physical vapor deposition method such as a reactive magnetron sputtering method, or a chemical vapor deposition method such as a metal organic chemical vapor deposition method.

15. A microelectromechanical device comprising:

a signal line formed on a substrate, the signal line whose input and output terminals are separated from each other at a predetermined gap;

a bottom electrode formed on the substrate while being separated from the signal line;

an anchor formed on the substrate while being separated from the bottom electrode;

a cantilever, one end of which is fixed to the anchor and the other end of which is suspended vertically to the bottom electrode, an open portion of the signal line and the substrate at a predetermined space;

a contact pad formed on the other end of the cantilever to face the open portion of the signal line; and a top electrode formed on the cantilever;

wherein at least one of the signal line and the contact pad is coated with a conductive oxide layer, wherein the body of each of the signal line and the contact pad is formed of a noble metal layer and coated with the conductive oxide layer.

16. The microelectromechanical device of claim 15, wherein the conductive oxide layer is formed of ruthenium oxide, iridium oxide, indium oxide, tin oxide, zinc oxide, or indium tin oxide.

17. The microelectromechanical device of claim 15, wherein the conductive oxide layer is formed by a physical vapor deposition method such a reactive magnetron sputtering method, or a chemical vapor deposition such as a metal organic chemical vapor deposition method.

18. A microelectromechanical device comprising:

a signal line formed on a substrate, the signal line whose input and output terminals are separated from each other;

a bottom electrode formed on the substrate while being separated from the signal line;

an anchor formed on the substrate while being separated from the bottom electrode;

a cantilever, one end of which is fixed to the anchor and the other end of which is suspended vertically to the bottom electrode, an open portion of the signal line, and the substrate;

a contact pad formed of a conductive oxide layer on the other end of the cantilever to face the open portion of the signal line; and a top electrode formed on the cantilever, wherein the signal line is formed of a noble metal layer.

19. The microelectromechanical device of claim 18, wherein the conductive oxide layer is formed of ruthenium oxide, iridium oxide, indium oxide, tin oxide, zinc oxide, or indium tin oxide.

20. The microelectromechanical device of claim 18, wherein the conductive oxide layer is formed by a physical vapor deposition method such as a reactive magnetron sputtering method, or a chemical vapor deposition such as a metal organic chemical vapor deposition method.

* * * * *